(12) United States Patent
Chapman et al.

(10) Patent No.: US 6,246,478 B1
(45) Date of Patent: Jun. 12, 2001

(54) RETICLE FOR AN OBJECT MEASUREMENT SYSTEM

(75) Inventors: Sydney George Chapman; Andrew Gordon Neil Walter, both of Winchester (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/318,170

(22) Filed: May 25, 1999

(30) Foreign Application Priority Data

Apr. 25, 1998 (GB) .................................................. 9808719

(51) Int. Cl.[7] ................................................ G01B 11/00
(52) U.S. Cl. ........................................ 356/397; 250/201.1
(58) Field of Search .................................... 356/375, 396, 356/397; 250/201.1, 234, 231.18, 237 R, 237 G; 341/3, 7, 10, 13

(56) References Cited

U.S. PATENT DOCUMENTS

| | | | |
|---|---|---|---|
| 2,484,103 | * 10/1949 | Lewis ................................... | 356/397 |
| 4,621,256 | 11/1986 | Rusk ..................................... | 340/347 |
| 4,908,656 | * 3/1990 | Suwa et al. ............................ | 355/53 |
| 5,300,786 | * 4/1994 | Brunner et al. ....................... | 356/401 |
| 5,389,774 | * 2/1995 | Gelman et al. .................... | 250/201.1 |
| 5,933,239 | * 8/1999 | Hoshiyama .......................... | 356/372 |

* cited by examiner

Primary Examiner—Hoa Q. Pham
(74) Attorney, Agent, or Firm—McGinn & Gibb, PLLC

(57) ABSTRACT

A reticle for an object measurement system comprises a pattern 10 having a plurality of pairs of contrasting elements in the form of black (11', 11" . . . 14'14") and white (21 . . . 24) wedges. Each black/white wedge pair defines a path towards a pattern origin 19 such that an edge of an object 50 occluding the path causes a change in contrast adjacent an edge point along the path. The pattern has a series of Gray-coded elements 15 associated with each pair of black/white wedges. The Gray-coded elements are indicative of an absolute coordinate of each edge point at which an object edge crosses a path. A series of triangles 16 associated with each pair of black/white wedges, whose absolute coordinates are known, allow a measurement system to provide accurate coordinates for each edge point.

20 Claims, 5 Drawing Sheets

RETICLE FOR AN OBJECT MEASUREMENT SYSTEM

FIELD OF THE INVENTION

The present invention relates to a reticle for an object measurement system, an object measurement system and a method of measuring an object. The reticle, in particular, allows an image measurement system to be self-calibrating and self-aligning.

BACKGROUND OF THE INVENTION

When digitising images, such as photographs, it is desirable to be able to automatically measure the size of the object being imaged so that the image may be reproduced to scale. When a camera is used to capture images of objects of different sizes, then an operator will often zoom in on the image, by varying the camera lens focal length, so that the object image fills as much of the viewfinder as possible. This allows for greater reproduction of picture quality because more image information is captured at source. It means, however, that the actual size of the object is independent of its size in captured image coordinates, pixels. To measure such an object accurately, it would normally be necessary to know the focal length of the lens, to determine image magnification and thus calculate the size of the object in absolute coordinates (millimeters).

Use of reticles to assist in determining the size of objects under magnification is well known. It is common to see a printed scale superimposed on images to enable a viewer to determine the size of an object, for example, a transparent ruler. Printed scales, however, are of little use in enabling a computer to determine the absolute size of an object being imaged when the magnification achieved by a zoom lens camera for each image is an unknown variable.

It is an object of the present invention to mitigate such problems.

DISCLOSURE OF THE INVENTION

According to a first aspect of the invention, there is provided a reticle for an object measurement system comprising a pattern having one or more pairs of contrasting elements, the or each pair of contrasting elements defining a path such that an edge of an object occluding said path causes a change in contrast adjacent an edge point along said path, the pattern having a coded element associated with the or each pair of contrasting elements, the or each coded element being indicative of an absolute coordinate of the or each edge point at which an object edge crosses a path.

In a further aspect there is provided an object measurement system including the reticle according to the invention.

In a yet further aspect there is provided a method of measuring an object placed on the reticle according to the invention.

DESCRIPTION OF THE PREFERRED EMBODIMENT

Figure 1:
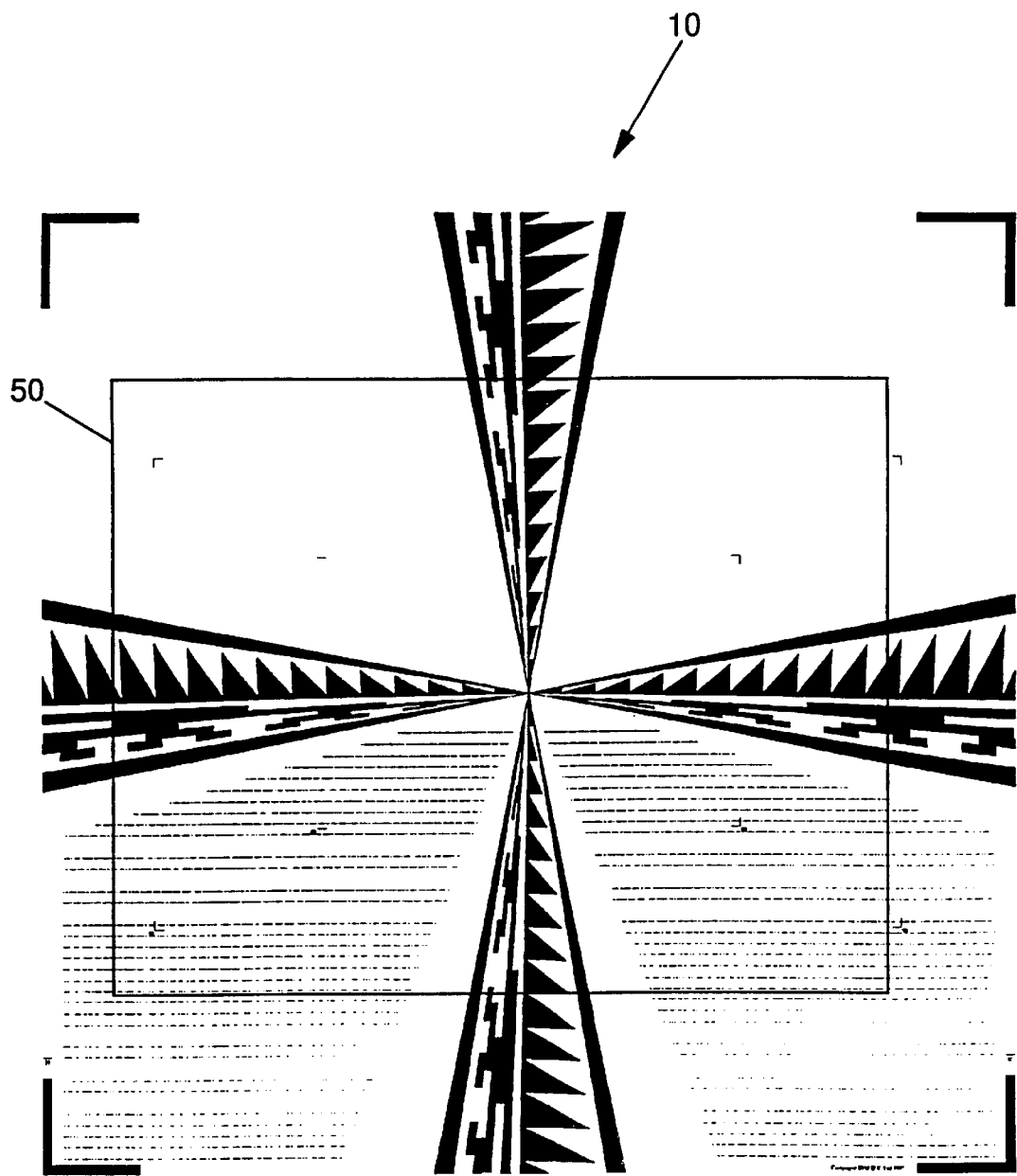
FIG. 1 is a detailed view of a reticle according to the invention and an object to be measured superimposed on the reticle.

Referring now to FIG. 1, a reticle 10 includes a printed background pattern used by a measurement system to measure the dimensions and to determine the location of a rectangular object 50 placed over the pattern by analyzing the unobscured portion of the pattern.

Figure 2:
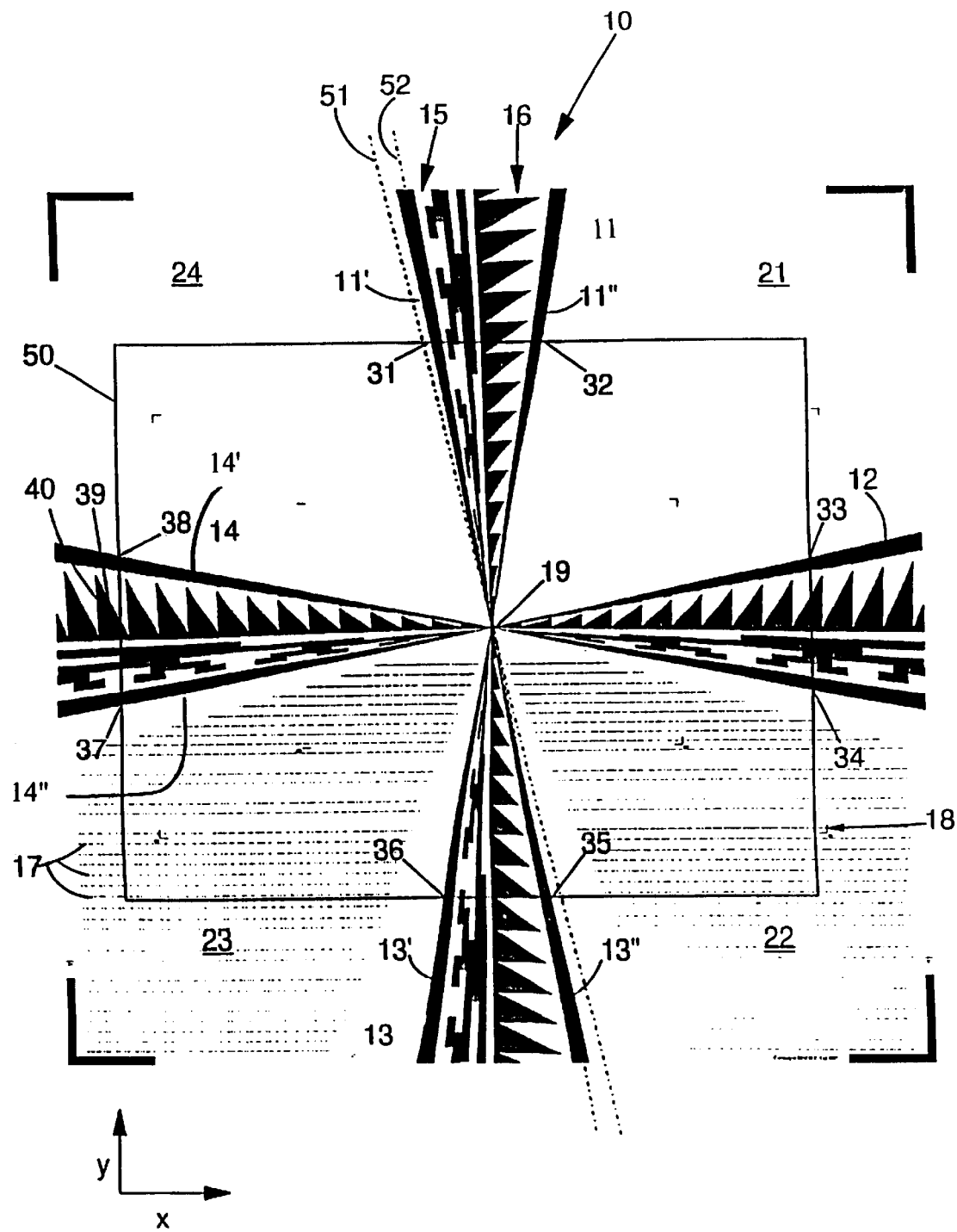
FIG. 2 is an enumerated view of the reticle of FIG. 1.

Referring now to FIG. 2, the pattern which has a white background contains the following areas:

A set of converging contrasting areas 11 . . . 14, radiate from the centre 19 of the pattern. These allow an object measurement system to determine the origin of the pattern as will be described later.

Each area 11 . . . 14 includes a pair of radiating black-wedges 11', 11" . . . 14', 14".

Between the black-wedges, each area 11 . . . 14 further incorporates one of a set of radiating Gray-code markers 15 which are used by the measurement system as a coarse scale. Use of Gray-code markers means there is one and only one bit change in the binary number of adjacent markers, so avoiding any possible confusion which could arise if two-bits changed simultaneously.

Also, located between the black-wedges, each area 11 . . . 14 further includes a series of triangular markings 16 which are used by the measurement system as a fine scale.

Other marks such as a set of fine parallel lines 17 and corner markings 18 help an operator to place the object 50 on the reticle. These marks are not used by the measurement system and do not interfere with the system operation.

The reticle pattern is preferably printed accurately onto print-media and measures approximately 1 m². Preferably, the pattern is printed using an ink-jet printer, which is likely to be more accurate than using photographic-enlargement from 8"×10" negatives methods.

Figure 3:
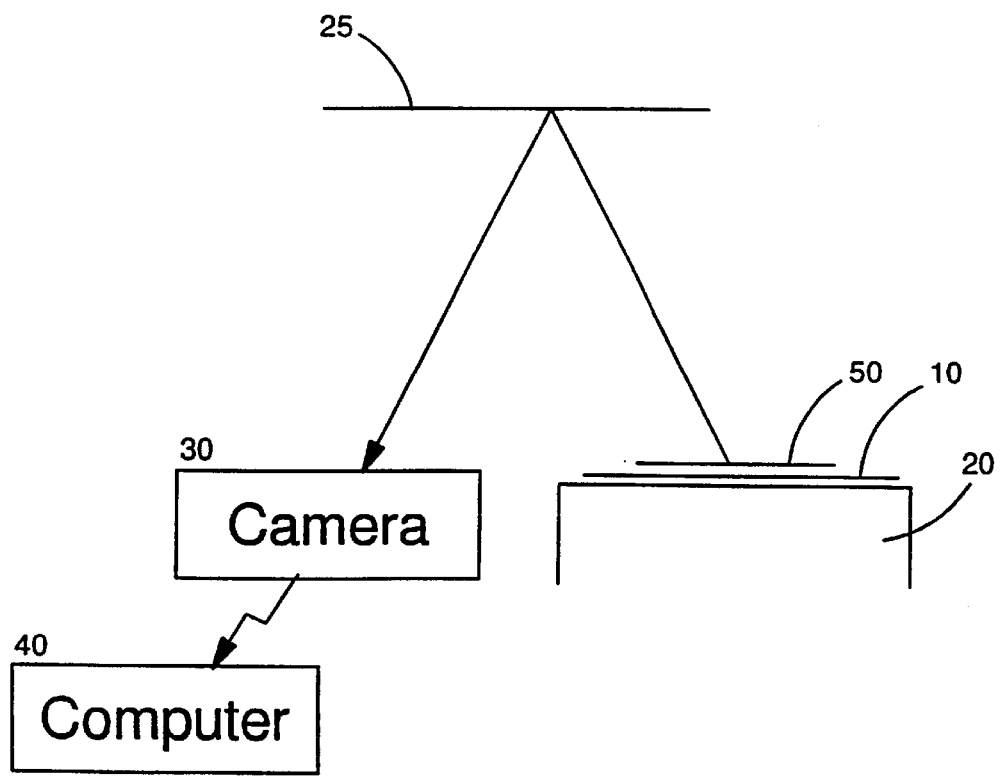
FIG. 3 is a schematic view of an object measurement system including the reticle of FIG. 1.

The reticle 10 is then installed in a measurement system on a bed 20 beneath a mirror 25 which reflects the image, including the reticle and object to be measured, onto a digital camera 30 which in turn is connected to a conventional computer 40, FIG. 3. The mirror 25 reflects the optical-path, allowing the camera 30 and object 50 to be placed at the same table top height for convenience.

Before or during installation, the dimensions in absolute coordinates of the reticle pattern in both the x and y axes, FIG. 2, are measured carefully, to produce independent scale-correction factors for X and Y.

As part of the installation process, the reticle pattern is aligned carefully with the camera 30, so that the X-axis of the camera-view lies parallel to the x-axis of the reticle pattern, and similarly with the y-axis. In other words, an object 50 placed exactly horizontally on the reticle should be seen as being horizontal in the captured camera image. The centre of the pattern 19 should be roughly near the centre of the camera image, but precision here is not required. In the present system, reticle alignment is to within ±1 degree of exactness, which is easily realised by visual inspection of images captured from the camera and displayed on the computer screen. As the system can easily extract the rotational mis-alignment (for example by scanning an unobstructed pattern for the Black Wedges) the system could be made to compensate for any rotational misalignment whatsoever. However, the logistics are simplified if the reticle is aligned with respect to the camera-image.

As part of the installation process, the focus of the camera should be set such that the reticle pattern and any objects placed on the reticle are in focus. The easiest way to achieve this is to use a camera with automatic focusing.

In use, the lens focal-length, and hence magnification, can be set by an operator, or automatically, such that all of the object 50 lies within the camera image. It is required that a small amount of the pattern should first be visible beyond each edge of the object, as it is the analysis of this unobscured or unoccluded portion of the pattern that produces the measurements required by the measurement system. The operator does not need to know what lens focal-length is used, and the measurement system does not need to know either.

Figure 4:
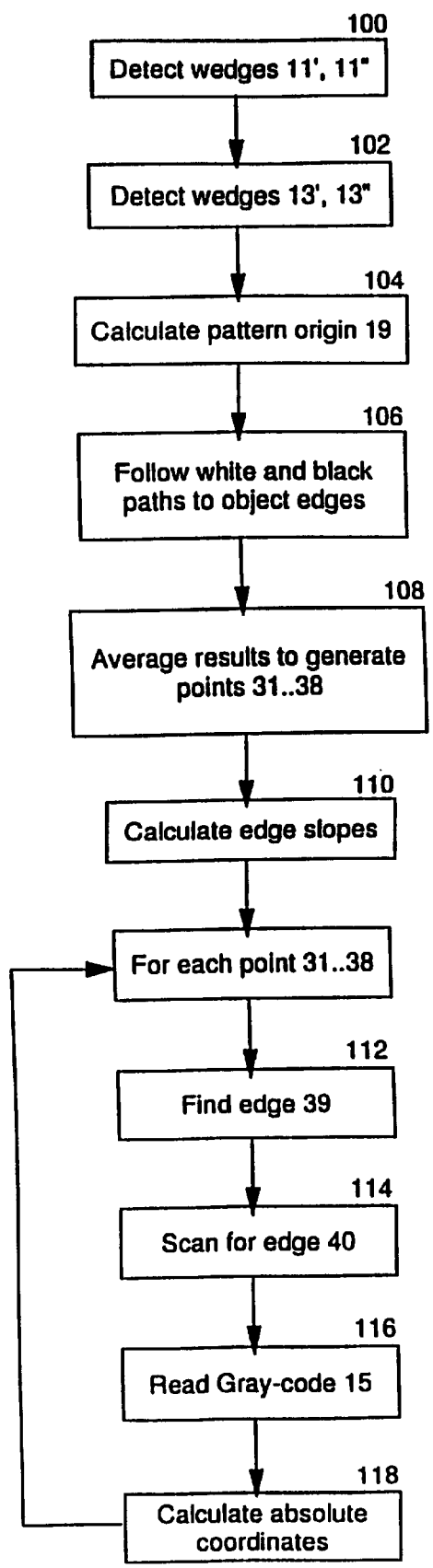
FIG. 4 is a flow diagram illustrating a method of measuring an object in the object measurement system of FIG. 3.

Once a camera image is obtained, digitised and transmitted to the computer 40, measurement software, FIG. 4, executes to analyze the image stored in memory ("the image") to locate and measure the object.

The software begins at step 100, by starting at the top of the image, to scan horizontally in left-to-right direction for a left black-wedge 11' in the converging area 11. At the same time or sequentially, the software searches from right-to-left for a right-hand-side black-wedge 11". If both wedges are not found, the search is repeated on the next image row down. This process is repeated until wedges 11', 11" are found. Since the wedge pattern is radially similar under enlargement, the areas of the image searched can be constrained, as the software should have an initial idea of where to expect to find the wedges. If all searches fail, an error is returned, informing the operator that the pattern is not in the field-of-view, or that some other error has occurred (e.g. camera failure).

At step 102, step 100 is repeated but starting at the bottom of the image, working upwards to locate left black wedge 13' and right black wedge 13". The coordinates of the 4 points found on the edges of black-wedges 11', 11" and 13', 13" form an 'X' pattern.

Step 104 generates a first estimate of the centre of the pattern from the intersection of a line joining the point on wedge 11', detected at step 100, to the point on wedge 13", detected at step 102, and similarly a line joining the point on wedge 11" to the point on wedge 13'. Due to quantisation in the captured image and the narrowness of the 'X' pattern in the y direction, the first estimate provides a better estimate of the X coordinate of the pattern origin than the Y coordinate. We call these coordinates xCentre, yCentre.

Steps 100 to 104 can be repeated in relation to areas 12 and 14 to get a second estimate of the pattern origin 19 providing a better estimate in the y direction. It will be seen that the calculation of the origin can be executed in many ways, for example, the origin could be calculated from the intersection of a line joined by a point on the upper edge of area 14 and a point on the lower edge of area 12 (or vice versa) and one of the lines from steps 100 and 102. This estimate would of course be equally accurate in both x and y directions. This means that if rotational skew is not to be measured, then only one black wedge per area 11 . . . 14 is required to perform the invention. It will also be seen that, if more than one point were found on a wedge, the pattern origin 19 could be determined by extrapolation from multiple points along the edge of one area, rather than interpolation between points from two areas.

It will be seen that lying between black-wedges from adjacent contrasting areas 11 . . . 14, ignoring the lines 17, are white-wedge areas 21 . . . 24, which similarly converge radially to the origin 19 of the reticle pattern. Typically, if the pattern is printed onto a white sheet, then these white-wedges are in fact invisible. Despite this, they define areas of the pattern which, with the exception of markings 17 and 18, do not have any markings on. Given that we know the position of the black wedges, the software can also compute the position of the white wedges. Since the wedges are invariant under enlargement, this can be done irrespective of the cameras focal-length (i.e. the software doesn't yet know the absolute measurements involved).

Thus, the 4 points which lie on the respective edges of black wedges 11', 11", 13', 13", are also 4 points which lie on the edges of white wedges. These points define 4 lines which look like superimposed 'X'es, one narrow (black wedges) and one a bit wider (white wedges).

The software takes these points on the edge of the white and black wedges and shifts horizontally for the areas 11, 13 and vertically for the areas 12, 14 to locate points within the white and black wedges. The degree of shift necessary is proportional to the distance from the pattern origin 19. A path from within a white wedge through the centre of the pattern 19 is known as a white path 51, and a path from within a black wedge through the centre of the pattern 19 is known as a black path 52, only one of each is indicated in FIG. 2.

At step 106, each pair of wedges in each area 11 . . . 14 of the image is taken in turn to simultaneously follow a path from the outer-ends of each black path and its adjacent white path, and track along these 2 paths (following path of lines defined above towards the xCentre, yCentre pattern origin). At each iteration along the white or black path, a running-average is kept of brightness, so that a locally-accurate estimate of what is White, and what is Black is generated. In this way illumination-independence is achieved. At each iteration, pixels which lie on the path ahead to the origin are examined. At some stage pixels which belong to the object 50 are detected, where the object obscures the pattern's white or black wedges. By taking the difference of the brightness changes between the white path 51 and the black path 52, object edges of any brightness can be detected.

Taking, for example, white path 51 brightness as 255 and black path 52 brightness as 0, the following equations illustrate a number of cases. In each equation, the first figure is the running average for white or black path brightness and the second figure is the next pixel brightness.

Case 1: Object not yet in view:

| | |
|---|---|
| Whitepath-Object = 255 − 255 | = 0 |
| Blackpath Object = 0 − 0 | = 0 |
| Difference | = 0 so No Object detected. |

Case 2: Object is white:

| | |
|---|---|
| Whitepath-Object = 255 − 255 | = 0 |
| Blackpath-Object = 0 − 255 | = −255 |
| Difference | = 255 so Object detected. |

Case 3: Object is black:

| | |
|---|---|
| Whitepath-Object = 255 − 0 | = 255 |
| Blackpath-Object = 0 − 0 | = 0 |
| Difference | = 255 so Object detected. |

Case 4: Object is grey(128):

| | |
|---|---|
| Whitepath-Object = 255 − 128 | = 127 |
| Blackpath-Object = 0 − 128 | = −128 |
| Difference | = 255 so Object detected. |

At step 108, the pixel locations along the white path and black path where the object edge is detected are averaged to get an intermediate single point resulting from one simultaneous search along a white and a black path so that step 106 generates two points 31 . . . 38 on each edge of the object 50. Each area 11 . . . 14 of the image thus produces a pair of object edge points 31, 32: 33, 34: 35, 36 and 37, 38 lying on the edge of wedges 11', 11" to 14', 14" respectively. At step 110, conventional trigonometry is used to calculate the slope of each object edge. This gives the rotational skew of the object, which can be corrected for later on.

Figure 5:
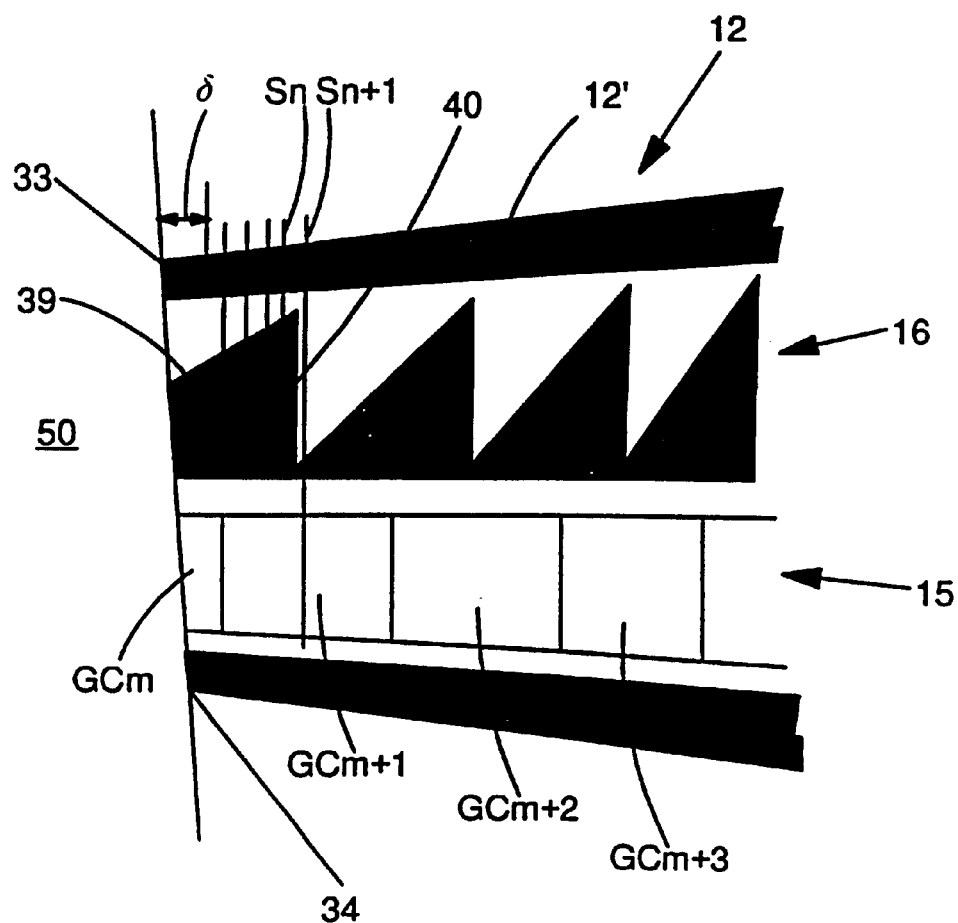
FIG. 5 is a detailed view of the relationship between a right-hand edge of an object and the reticle pattern.

At step 112, for each edge point 31 . . . 38, the software backs-out a small distance, delta=10 pixels, away from the Object, FIG. 5, to get away from any blurring of the captured image. Scanning along X or Y directions (using whichever is nearly parallel to the edge in question), the software searches for a white to black transition designating a sloping edge 39 of one of the small black triangles 16. Once a point on the edge 39 of the triangle is detected, the software tracks the sloping edge 39 to scan outwards and find the edge of the triangle 40 which is nearly parallel to the object edge, step 114. It will be seen that the triangles form a 'ratchet' or 'saw-tooth' pattern, and by following the 'saw' edge 39, a sudden jump occurs between the scanlines Sn and Sn+1 when the scan crosses over the triangle apex and the edge 40 which is roughly parallel to the object edge. The software then scans along and perpendicular to the scanline Sn+1 towards the edge 40 to derive a series of image coordinates for points along the triangle edge 40. Thus, the edge points detected by the series of scanlines Sn, Sn+1 etc as well as the edge points detected by the scanlines perpendicular to Sn+1 determine the geometry of the triangle in image coordinates.

It should also be noted that the slope of the edge 39 of the triangles decreases towards the centre of the pattern. This is because in the present embodiment, each triangle and associated Gray-code marks are chosen to occupy a fixed absolute length, so the base of every triangle is the same. Given that it is desirable to have as much "ratchet" effect as possible, each triangle occupies as much vertical-height (in the case of areas 12, 14) as possible. So, fixed horizontal+ variable vertical or vice versa for areas 11, 13 results in variable slope.

In an alternative embodiment, the width of each triangle scales along with the rest of the pattern, to make it all even more zoom-independent than in the present embodiment.

Steps 112 and 114 detect accurately (in image coordinates) a triangle belonging to the pattern, which lies just outside the edge of the object. Step 116 continues by scanning substantially parallel to the edge 40 across a Gray-code pattern 15. The Gray-code pattern comprises a sequence of Gray-code digits some of which GCm . . . GCm+3 are shown in outline. It will be seen that the transition from one Gray-code digit to the next is offset from the triangle edges 40 to increase system tolerance. The detected Gray-code digit, in this case GCm+1, determines which triangle has been detected. So, the Gray-code has given a coarse-scale (typically triangles are numbered in pairs-of-gray-values, (0, 1), (2, 3), (4, 5) up to (26, 27) in the present embodiment, although single Gray-values could be used just as easily). Since, the software knows the precise geometry of the printed triangle in absolute coordinates (millimeters), and also precisely where it is in local image-coordinates (pixels), at step 118 it calculates back to determine the absolute X and Y coordinates of all the edge-points 31 . . . 38 detected at step 108.

It will be seen that the triangles in areas 11 and 13 define the Y scale and coordinates of the pattern while the near vertical edges of the object and areas 12 and 14 give accurate X coordinates for the left and right sides of the object.

The software now knows the width of the object 50, by subtraction of the absolute coordinates of the left and right sides. The software knows the object height from consideration of the top and bottom edges. The rotational skew is generated by summation and averaging of the rotational-skew of each of the four edges.

Because the software measures each edge-point 31 . . . 38 locally, this makes the system tolerant to distortion. It should be noted that the mirror 25, not being optically-flat, introduces wave-like ripply patterns in the Image. Despite this, these ripples are not locally significant, so the accuracy of the system is not impaired significantly, unlike any systems that might make use of counting pixels-widths in the image combined with lens-geometry-knowledge (which the present invention doesn't rely on, and doesn't require).

The measurement system according to the invention has considerable benefits, as the reticle 10 is cheap to produce, and avoids the need to use high-quality lenses with accurately-known and accurately-calibrated light-paths.

The system has been described in relation to rectangular objects, but could be applied to other shapes. For example, it could be extended by the use of more radial-wedge-pairs to cope with regular pentagons, hexagons etc, or triangles or other polyhedra. The only principle requirement is that the edges of the objects should be of the same size/scale as the portions of wedges used to detect those edges. Conceptually, the system could be used to measure objects with curved or partly-curved circumferences, eg circles, ellipses, segments of circles, etc.

The invention lies in the local-patterning of the reticle which can be uniquely recognised and identified, independently of the remainder of the pattern.

Various procedures can be applied to make the system error-proof. Firstly, when scans of the image are taken looking for edges, the software requires maximum accuracy of measurement of local-white and local-black, as illumination variations, lens-performance etc will change brightness locally within the image. To correct for these variations, the software preferably performs scans of parts of the pattern known to be wholly-white or wholly black. This way brightness-independence can be achieved.

Enlargement-invariant patterns (the black and white wedges) independent of lens focal length are used, and the geometry of the lines delineating the edges of the Gray-code-bits also radiate from the centre of the pattern in the same enlargement-invariant way, so that the geometry to calculate where the wedge-edges, triangles, and Gray-code bits lie is independent of the lens-focal-length/zoom setting.

It will be seen that the invention allows the measurement system to determine the absolute size of an object placed on the reticle from a first captured image including an unobscured portion of the reticle pattern. This determination of the size of an object is automatic and gained independently of the lens magnification or setting. The measurement system can use the size of the object in image coordinates (pixels) to zoom in on the object so that it fills substantially the entire image space of the camera, allowing for rotational skew, and capture a second image at a higher quality than for the first captured image. But, because the absolute size of the object has been determined from the first image, the second image can be reproduced later in actual or scaled size but at maximum picture quality.

It will also be seen that the invention has many other advantages. The reticle need not be aligned accurately with respect to camera location and the system is tolerant to object rotation, object position, object colour variations, distortions in the optical path and variations in lens aperture/image brightness.

Finally, it should be seen that it is possible for the reticle to include a plurality of patterns, each emanating from a respective origin, to allow a system to measure and locate any number of objects placed on the reticle.

What is claimed is:

1. A reticle for an object measurement system comprising:
   a pattern having one or more pairs of contrasting elements, the one pair or each pair of contrasting elements defining a path such that an edge of an object occluding said path causes a change in contrast adjacent an edge point along said path, the pattern having a coded element associated with the one pair or each pair of contrasting elements, the one coded element or each coded element being indicative of an absolute coordinate of the one edge point or each edge point at which an object edge crosses a path.

2. A recticle as claimed in claim 1 wherein the pattern includes at least two pairs of contrasting elements.

3. A reticle as claimed in claim 2 wherein said at least two pairs of contrasting elements define respective paths towards a pattern origin.

4. A reticle as claimed in claim 3 wherein each pair of contrasting elements comprises a black wedge and an adjacent white wedge radiating from said pattern origin.

5. A reticle a claimed in claim 3 further comprising a pattern of triangles associated with each pair of contrasting elements and radiating from said pattern origin, each of said triangles in cooperation with a coded element allowing an accurate indication of the absolute coordinate of each edge point.

6. A reticle as claimed in claim 1 wherein the coded element or each coded element comprises a series of Gray coded markers running adjacent an associated pair of contrasting elements.

7. An object measurement system including:
a reticle as defined in claim 1, said reticle for receiving objects;
a digital camera spaced apart from said reticle, said camera having a variable focal length and being adapted to capture images of said objects placed on said reticle; and
a computer connected to said digital camera, said computer being adapted to store images captured by said camera and to store dimensions of said reticle pattern in absolute coordinates.

8. A method of measuring an object placed on a reticle, said reticle including a pattern having at least two pairs of contrasting elements, each pair of contrasting elements defining a path such that an edge of an object occluding said path causes a change in contrast adjacent an edge point along said path, the pattern having a coded element associated with each pair of contrasting elements, each coded element being indicative of an absolute coordinate of each edge point at which an object edge crosses a path, said method including:
acquiring a first image of said object and at least a portion of said reticle pattern;
scanning said first image to detect a set of reference points outside said object on said reticle, each reference point lying on an edge between each element of said pairs of contrasting elements;
traversing respective contrasting paths within each element of said pairs of contrasting elements, said paths beginning at points shifted a pre-determined distance into said elements from said reference points; and
detecting a change in contrast along said contrasting paths where said object crosses said contrasting paths indicative of the respective coordinates of edge points of said object.

9. A method as claimed in claim 8, further comprising:
determining a location in image coordinates of said pattern origin from said set of reference points,
wherein said traversing traverses contrasting paths towards said pattern origin.

10. A method as claimed in claim 8, further comprising:
determining a set of edge point locations in image coordinates by averaging the locations in image coordinates of the points between which a change of contrast along said contrasting paths is detected.

11. A method as claimed in claim 10, further comprising:
determining a rotational skew of an object relative to said reticle pattern from the locations in image coordinates of any two edge points on the same edge of an object.

12. A method as claimed in claim 10, wherein said reticle further comprises a pattern of triangles associated with each pair of contrasting elements, said method further comprising:
deriving the absolute coordinates of each of said edge point locations by:
stepping away from the edge point location at substantially right angles from said edge;
scanning along a line substantially parallel to said edge to detect an edge of a triangle;
repeating said scanning until an apex of said triangle is detected;
scanning from said apex along a line substantially parallel to said edge to read a coded element adjacent said triangle;
determining from said coded element the absolute coordinates of said triangle; and
calculating the absolute coordinate of said edge point according to the absolute coordinates of said triangle.

13. A method according to claim 12, further including:
calculating the dimensions of an object by subtracting the absolute coordinates of edge points on opposite edges of said object.

14. A method of according to claim 8 further comprising:
acquiring a second image of said object at a magnification sufficient to substantially exclude said reticle pattern front said image.

15. A reticle for an object measurement system comprising:
a configuration having one or more pairs of contrasting elements, the one pair or each pair of contrasting elements defining a path such that an edge of an object occluding said path causes a change in contrast adjacent an edge point along said path,
the configuration having a coded element associated with the one pair or each pair of contrasting elements.

16. A reticle as claimed in claim 15, wherein the one coded element or each coded element is indicative of an absolute coordinate of the one edge point or each edge point at which an object edge crosses a path.

17. A reticle as claimed in claim 15, wherein the pattern includes at least two pairs of contrasting elements.

18. A reticle as claimed in claim 17, wherein said at least two pairs of contrasting elements define respective paths towards a configuration origin.

19. A reticle as claimed in claim 18, wherein each pair of contrasting elements comprises a black wedge and an adjacent white wedge radiating from said configuration origin.

20. A reticle as claimed in claim 15, wherein the coded element or each coded element comprises a series of Gray coded markers running adjacent an associated pair of contrasting elements.

* * * * *